United States Patent
Chern et al.

[19]

[11] Patent Number: 6,140,202

[45] Date of Patent: Oct. 31, 2000

[54] METHOD OF FABRICATING DOUBLE-CYLINDER CAPACITOR

[75] Inventors: Horng-Nan Chern, Tainan Hsien; Kun-Chi Lin, Hsinchu, both of Taiwan

[73] Assignee: United Microelectronics Corp., Hsinchu, Taiwan

[21] Appl. No.: 09/208,739

[22] Filed: Dec. 8, 1998

[51] Int. Cl.⁷ .............................................. H01L 21/8242
[52] U.S. Cl. ........................................... 438/396; 438/253
[58] Field of Search ................................. 438/240, 253, 438/396, FOR 212, FOR 220, FOR 430, 696, 239; 148/DIG. 14

*Primary Examiner*—George Fourson
*Assistant Examiner*—Barbara Elizabeth Abbott
*Attorney, Agent, or Firm*—Charles C. H. Wu; Charles C.H. Wu & Associates

[57] ABSTRACT

A method for fabricating a double-cylinder capacitor is provided. The double-cylinder capacitor has a storage electrode having dual, concentric cylinder structures. The dielectric layer and the top electrode are formed in sequence over the bottom electrode. The storage area is thus enlarged by the double-cylinder capacitor of the invention. Thus, the capacitance of the capacitor can be effectively increased.

17 Claims, 7 Drawing Sheets

METHOD OF FABRICATING DOUBLE-CYLINDER CAPACITOR

BACKGROUND OF THE INVENTION

1. Field of the Invention

The present invention relates to a semiconductor fabricating method. More particularly, the present invention relates to an improved method of fabricating a Dynamic Random Access Memory (DRAM) capacitor.

2. Description of the Related Art

As the function of a microprocessor becomes more powerful and the amount of computation being processed by software programs increases, required memory capacity increases correspondingly. The capacitor is the heart for storing input signal in the DRAM. As the amount of charges stored in a capacitor increases, soft errors easily occur. The performance of the capacitor thus is decreased. There are three methods for increasing the storage capacity of the capacitor. (1) A dielectric layer with a high dielectric constant is used to increase the amount of charges stored in per unit area of a capacitor. (2) The thickness of a dielectric layer is reduced to obtain an increased capacitance. However, the thickness of the dielectric layer that can be reduced is limited in order to maintain the quality of the dielectric layer. (3) The surface area of a capacitor is increased to increase the amount of charges stored in a capacitor. However, as the surface area of a capacitor increases, the integration of a device decreases.

A two-dimensional planar type capacitor is used in an integrated circuit for a conventional DRAM that stores only a small amount of charge. The planar-type capacitor occupies a sizeable surface area on a substrate. Hence, the planar type capacitor is not suitable for a highly integrated DRAM. To achieve a highly integrated DRAM, a three-dimensional capacitor, such as a stacked-type or a trench-type capacitor, is adopted. However, to realize a semiconductor device of an even higher degree of integration, even a simple three-dimensional capacitor is insufficient.

FIGS. 1A through 1D are schematic, cross-sectional views showing a conventional fabricating method of a cylindrical capacitor.

Figure 1A:
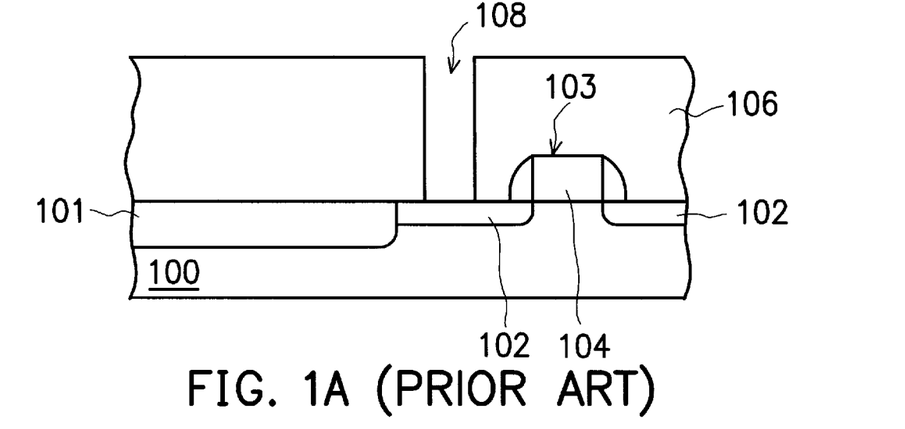
FIGS. 1A through 1D are schematic, cross-sectional views showing a conventional fabricating method of a cylindrical capacitor.

In FIG. 1A. an isolation structure 101 is formed on a semiconductor substrate 100. The isolation structure 101 is used to define active regions of the semiconductor substrate 100. A DRAM transistor 103 is formed on the semiconductor substrate 100. The transistor 103 includes a gate 104 and a source/drain region 102. The source/drain region 102 is located in the semiconductor substrate 100 beside the gate 104. A dielectric layer 106 is formed over the semiconductor substrate 100. The dielectric layer 106 is patterned to form a storage node opening 108 through the dielectric layer 106 and expose the source/drain region 102.

Figure 1B:
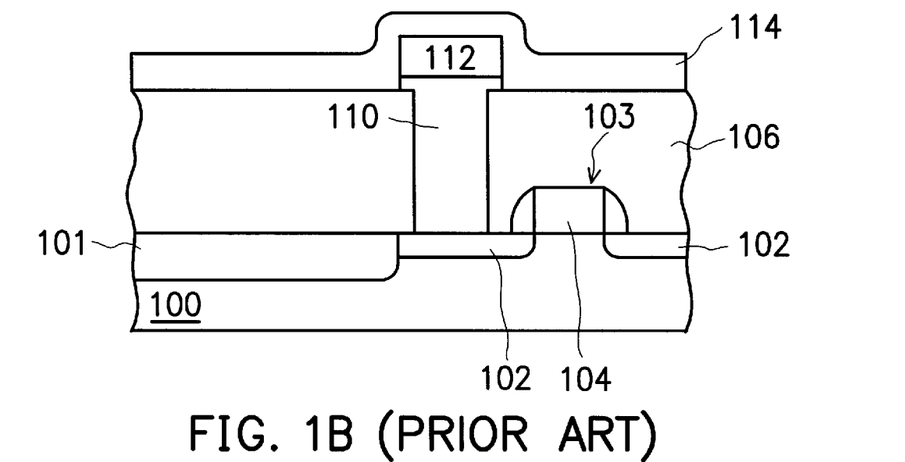

In FIG. 1B, a first polysilicon layer 110 is formed on the dielectric layer 106 to fill the storage node opening 108. A patterned oxide layer 112 is formed on the first polysilicon layer 110. The patterned oxide layer 112 is aligned with the storage node opening 108. A second polysilicon layer 114 is formed over the semiconductor substrate 100.

Figure 1C:
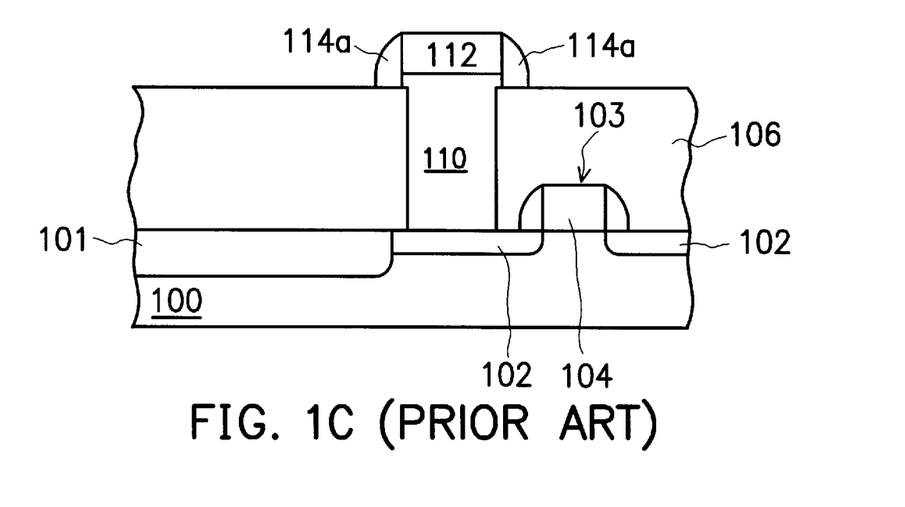

In FIG. 1C, anisotropic etching is performed to remove a portion of the second polysilicon layer 114 until the dielectric layer 106 and the patterned oxide layer 112 are exposed. A polysilicon spacer 114a remaining from the second polysilicon layer 114 is formed on the sidewall of the oxide layer 112.

Figure 1D:
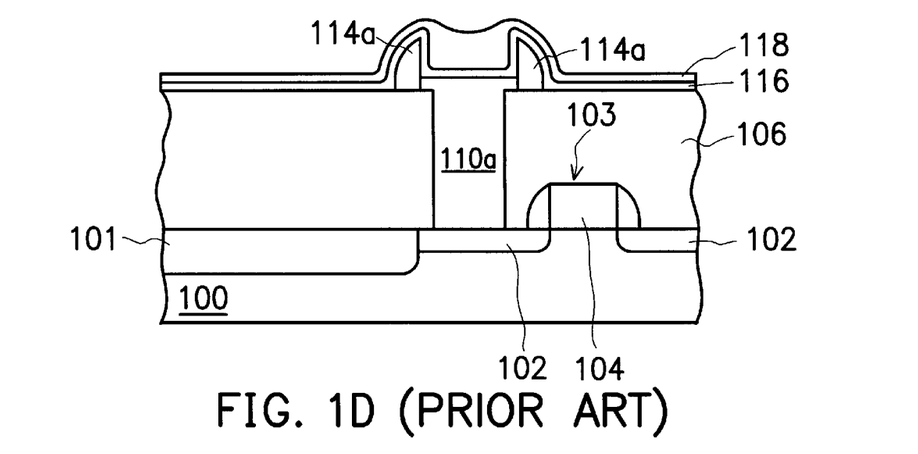

In FIG. 1D, wet etching is performed to remove the oxide layer 112. A storage electrode is formed. The storage electrode is composed of the first polysilicon layer 110 and the second polysilicon layer 114a. A thin dielectric layer 116 and a top electrode 118 are formed in sequence over the semiconductor substrate 100.

Figure 2A:
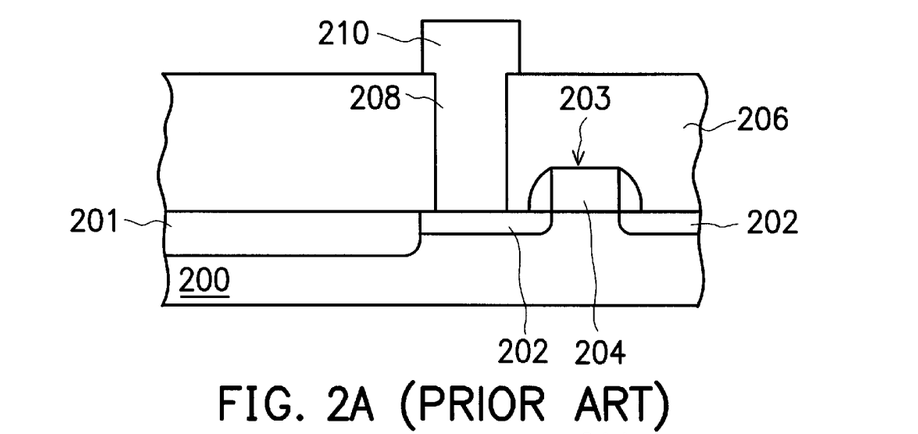
FIGS. 2A through 2B are schematic, cross-sectional views showing a conventional fabricating method of another cylindrical capacitor.
Figure 2B:
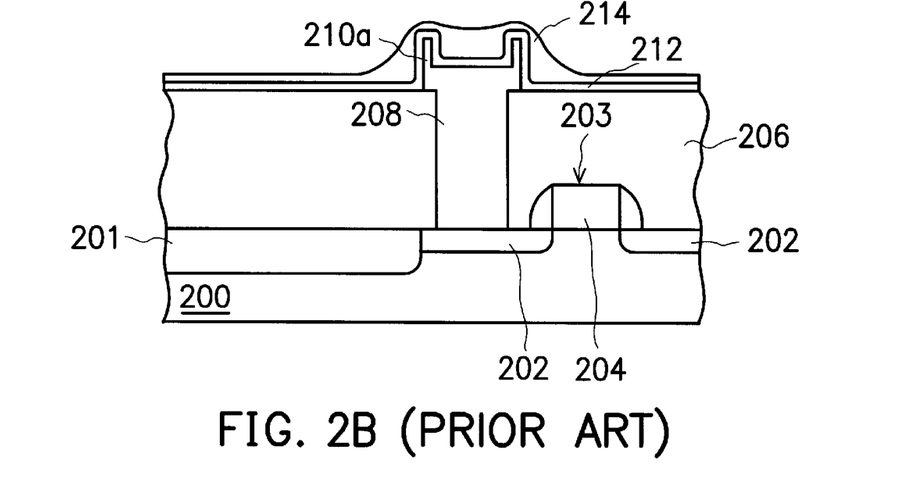

FIGS. 2A through 2B are schematic, cross-sectional views showing a conventional fabricating method of another cylindrical capacitor.

In FIG. 2A, an isolation structure 201 is formed in the semiconductor substrate 200. The isolation structure 201 is used to define active regions of the semiconductor substrate 200. A DRAM transistor 203 is formed on the semiconductor substrate 200. The transistor 203 includes a gate 204 and a source/drain region 202. The source/drain region is located in the semiconductor substrate 200 beside the gate 204. A dielectric layer 206 is formed over the semiconductor substrate 200. The dielectric layer 206 is patterned to form a storage node opening 208. The storage node opening 208 is formed through the dielectric layer 206 to expose the source/drain region 202. A patterned polysilicon layer 210 is formed on the dielectric layer 206. The patterned polysilicon layer 210 fills the storage node opening 208 to electrically couple with the source/drain region 202.

In FIG. 2B. a portion of the polysilicon layer 210 above the storage node opening 208 is removed by a conventional photolithography process. A polysilicon layer 210a remains from the polysilicon layer 210. A cylindrical capacitor is formed by the polysilicon layer 210a. A thin dielectric layer 212 and a top electrode 214 are formed in sequence over the semiconductor substrate 200.

However to realize a capacitor with an even higher degree of integration, the conventional capacitor of such a simple cylindrical shape is not sufficient. The surface area of the capacitor that can be increased is limited. Thus, the capacitance of the conventional capacitor is limited. Difficulty is still encountered when trying to increase the capacitance while decreasing the planar area of a capacitor. Moreover, in the conventional capacitor described by FIG. 2A and FIG. 2B, two photolithography processes have to be carried out, which makes the process more complicated.

SUMMARY OF THE INVENTION

One aspect of the invention is to provide a capacitor that effectively increases the capacitance.

Another aspect of the invention is to provide a capacitor that can be completed with a simplified process.

To achieve these and other advantages and in accordance with the purpose of the invention, as embodied and broadly described herein, the invention provides a method of fabricating a capacitor. The method of the invention includes the following steps. A substrate having a transistor is provided. The transistor comprises a source/drain region and a gate. The source/drain region is located in the substrate beside the gate. A first dielectric layer is formed over the substrate. A storage node opening is formed through the dielectric layer to expose the source/drain region. A first polysilicon layer is formed over the dielectric layer to fill the storage node opening and electrically couple with the source/drain region. A thin oxide layer and a second polysilicon layer are formed in sequence over the substrate. A portion of the second polysilicon layer is removed to leave another portion of the second polysilicon layer aligned with the storage node opening. A portion of the thin oxide layer is removed to leave another portion of the thin oxide layer aligned with the storage node opening. The planar area of the remaining thin oxide layer is smaller than the remaining second polysilicon layer. A material layer is formed in contact with the thin oxide layer between the second polysilicon layer and the first polysilicon layer. The planar area composed of the material layer and the thin oxide layer is the same as the planar area of the remaining second polysilicon layer. A spacer is formed on the sidewall of the second polysilicon layer and the material layer. The thin oxide layer, the spacer, and the material layer are used as etching stop layers to remove the second polysilicon layer, and the first polysilicon layer exposed by the thin oxide layer, the spacer, and the material layer. Regions of the thin oxide layer the spacer, and the material layer together form a storage-electrode region. The thin oxide layer and the spacer are used as masks to removed the material layer and a portion of the first polysilicon layer until the dielectric layer is exposed. A portion of the first polysilicon layer of the storage-electrode region is removed to leave a thickness under the former location of the material layer. The thin oxide layer and the spacer are removed to form a storage electrode. The storage electrode is formed by the first polysilicon layer. A second dielectric layer and a top electrode are formed over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3H are schematic, cross-sectional views showing a fabricating method of a double-cylinder capacitor according to one preferred embodiment of the invention.

Figure 3A:
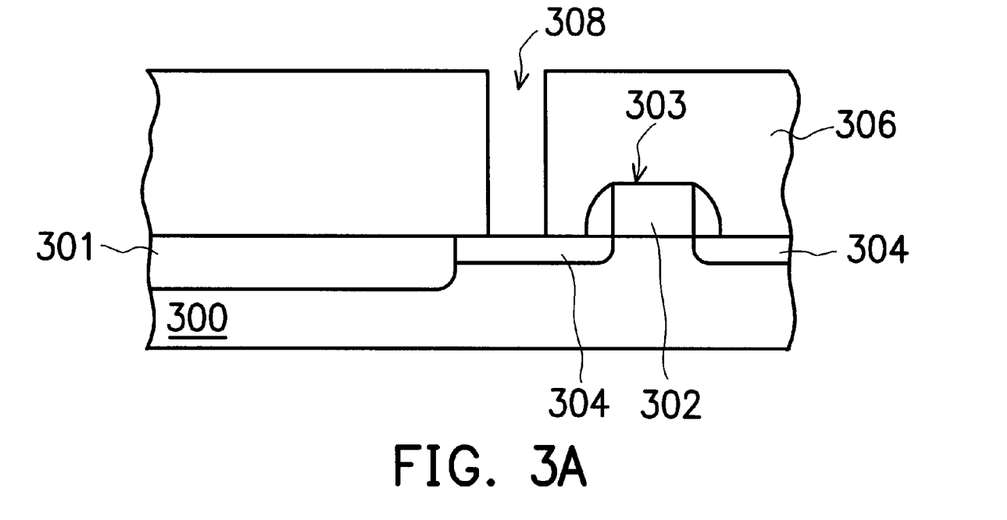
FIGS. 3A through 3H are schematic, cross-sectional views showing a fabricating method of a double-cylinder capacitor according to one preferred embodiment of the invention.

In FIG. 3A, an isolation structure 301 is formed in a semiconductor substrate 300. The isolation structure 301 is used to define active regions of the semiconductor 300. A DRAM transistor 303 is formed on the semiconductor substrate 300. The transistor comprises a gate 302 and a source/drain region 304. The source/drain region 304 is in the semiconductor substrate 300 beside the gate 302. A dielectric layer 306 is formed over the semiconductor substrate 300. The dielectric layer 306 is patterned to form a storage node opening 308. The storage node opening 308 is formed through the dielectric layer 306 to expose the source/drain region 304 of the transistor 303.

The semiconductor substrate 300 can be a P-type silicon substrate, for example. The isolation structure 301 can be formed by local oxidation (LOCOS) or shallow trench isolation (STI), for example. The material of the dielectric layer 306 can be silicon oxide, tetra-ethyl-ortho-silicate (TEOS), borophosphosilicate glass (BPSG), or other suitable dielectric material. The dielectric layer 306 can be formed by chemical vapor deposition (CVD), for example.

Figure 3B:
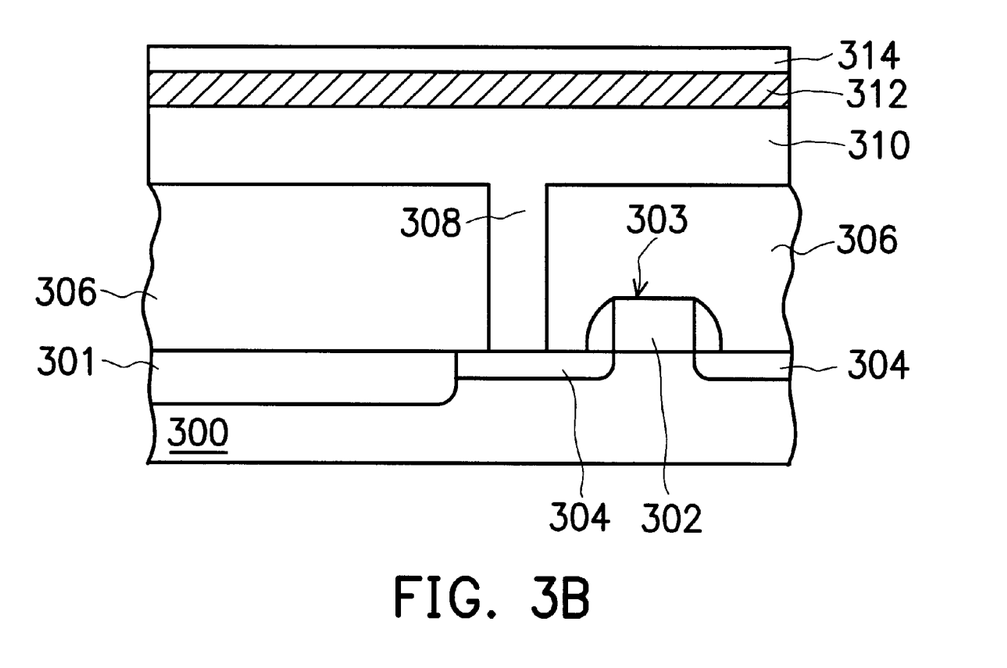

In FIG. 3B a first polysilicon layer 310 is formed on the dielectric layer 306. The first polysilicon layer 310 fills the storage node opening 308 and electrically couples with the source/drain region 304. The first polysilicon layer 310 has a thickness sufficient to form a storage electrode (shown in FIG. 3G). The first polysilicon layer 310 can be formed by chemical vapor deposition. A thin oxide layer 312 and a second polysil icon layer 314 are formed in sequence over the first polysilicon layer 310.

Figure 3C:
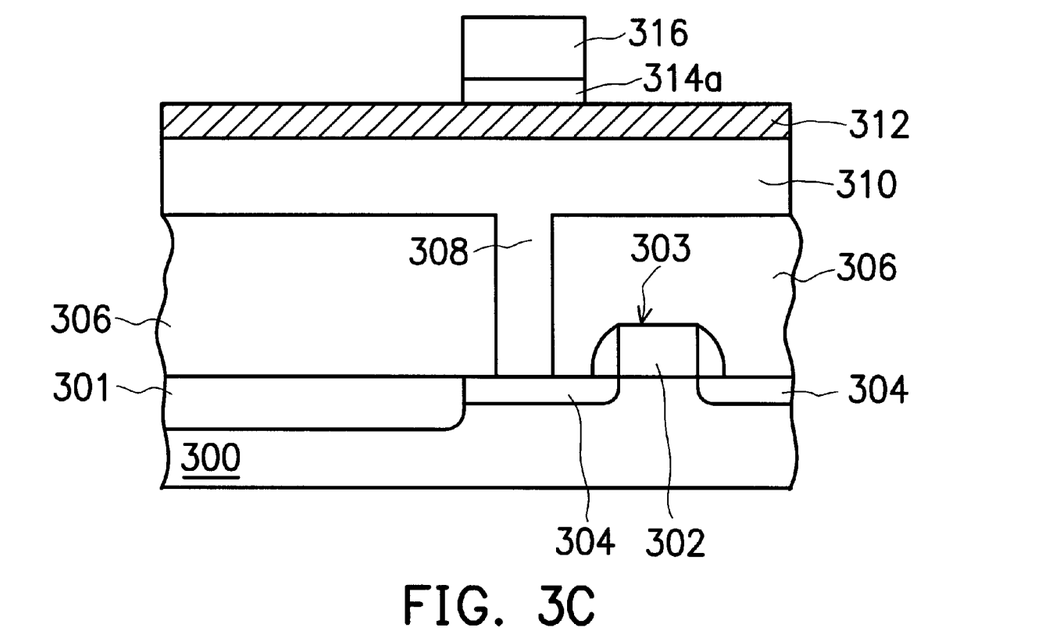

In FIG. 3C, a patterned photoresist layer 316 is formed on the second polysilicon layer 314. The patterned photoresist layer 316 is used as an etching mask. The patterned photoresist layer 316 is aligned with the storage node opening 308. A portion of the first polysilicon layer 310 located below the patterned photoresist layer 316 is used to form the storage electrode. An etching step is performed. Thus, the second polysilicon layer 314 is patterned to leave a second polysilicon layer 314a between the photoresist layer 316 and the thin oxide layer 312. The second polysilicon layer 314a is aligned with the storage node opening 308.

Figure 3D:
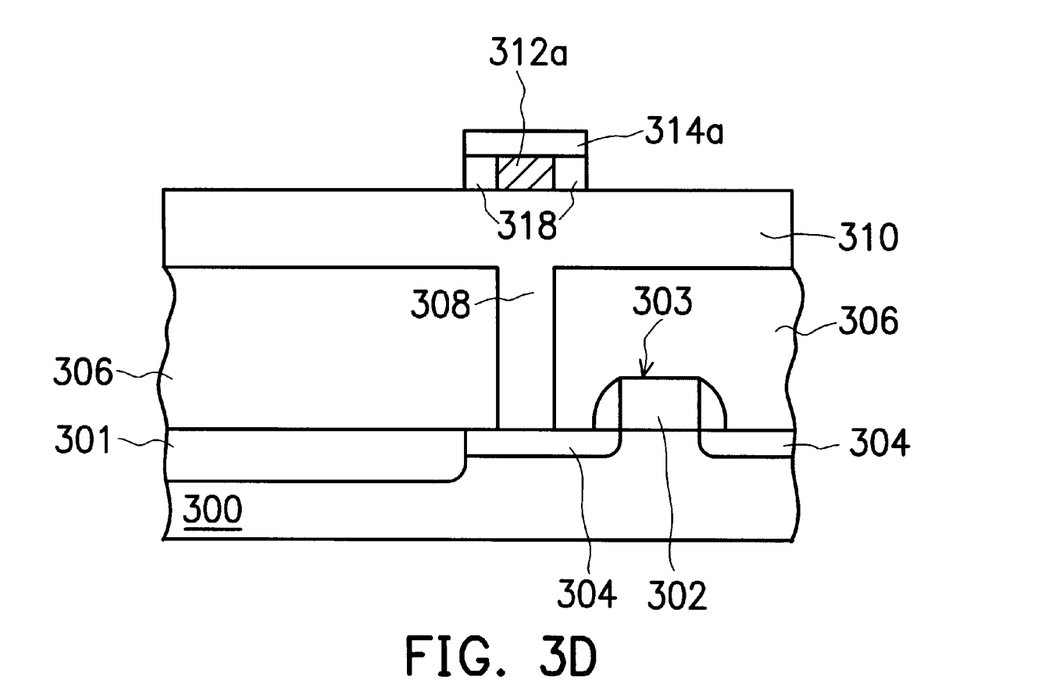

In FIG. 3D, the patterned photoresist layer 316 is removed exposing the upper surface of the polysilicoi layer 314a. A portion of the thin oxide layer 312 is removed to leave a thin oxide layer 312a aligned with the storage node opening 308. The removal of the thin oxide layer 312 is conducted in such a way that a portion of the top surface of the first polysilicon layer 310 is exposed. The thin oxide layer 312 can be removed by isotropic etching. The remaining thin oxide layer 312a is formed between the second polysilicon layer 314a and the first polysilicon layer 310. The planar area of the thin oxide layer 312a is smaller than the planar area of the second polysilicon layer 314a. A material layer (not shown) is formed over the dielectric layer 310. The material layer is in contact with the thin oxide layer 312a between the second polysilicon layer 314a and the first polysilicon layer 310. The material of the material layer preferably is silicon nitride. A portion of the material layer is removed by etching back. A material layer 318 remains between the second polysilicon layer 314a and the dielectric layer 310 after the etching back step. The combined planar area of the material layer 318 and the thin oxide layer 312a is substantially the same as the planar area of the second polysilicon layer 314a.

Figure 3E:
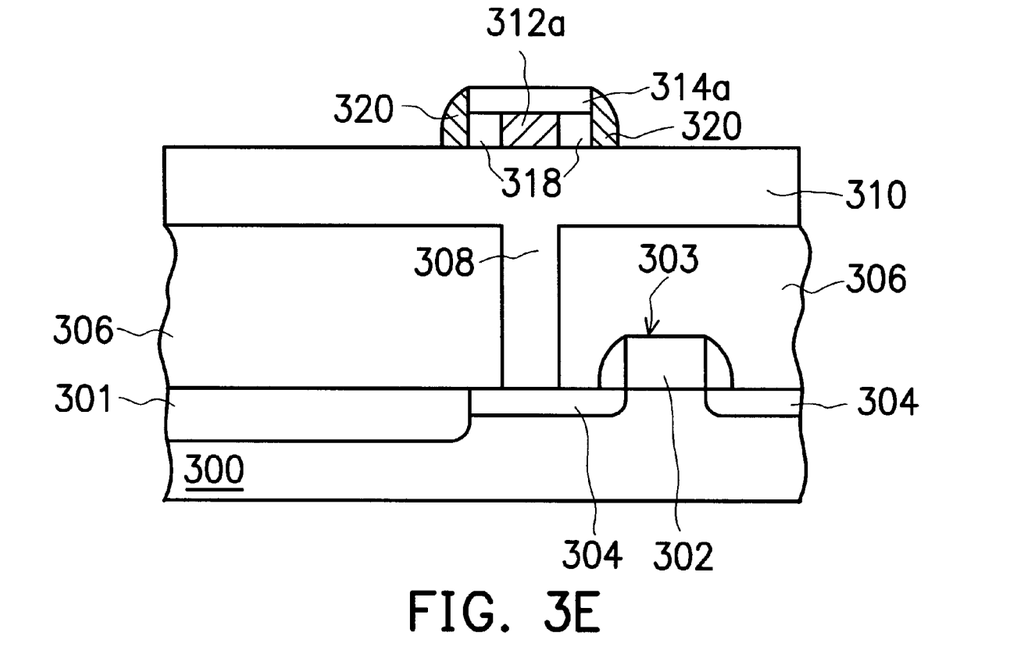

In FIG. 3E, a spacer 320 is formed on the sidewall of the second polysilicon layer 314a and the material layer 318. The material of the spacer 320 preferably is oxide. The exemplary steps of forming the spacer 320 include forming an oxide layer over the first polysilicon layer 310 by chemical vapor deposition, and then etching back the oxide layer to form the oxide spacer. Preferably, the etching rate of the spacer 320 and the thin oxide layer 312a are roughly the same. The spacer 320 and the thin oxide layer 312a are used as masks when etching the first polysilicon layer 310 to form the storage electrode in the next step (shown in FIG. 3G).

Figure 3F:
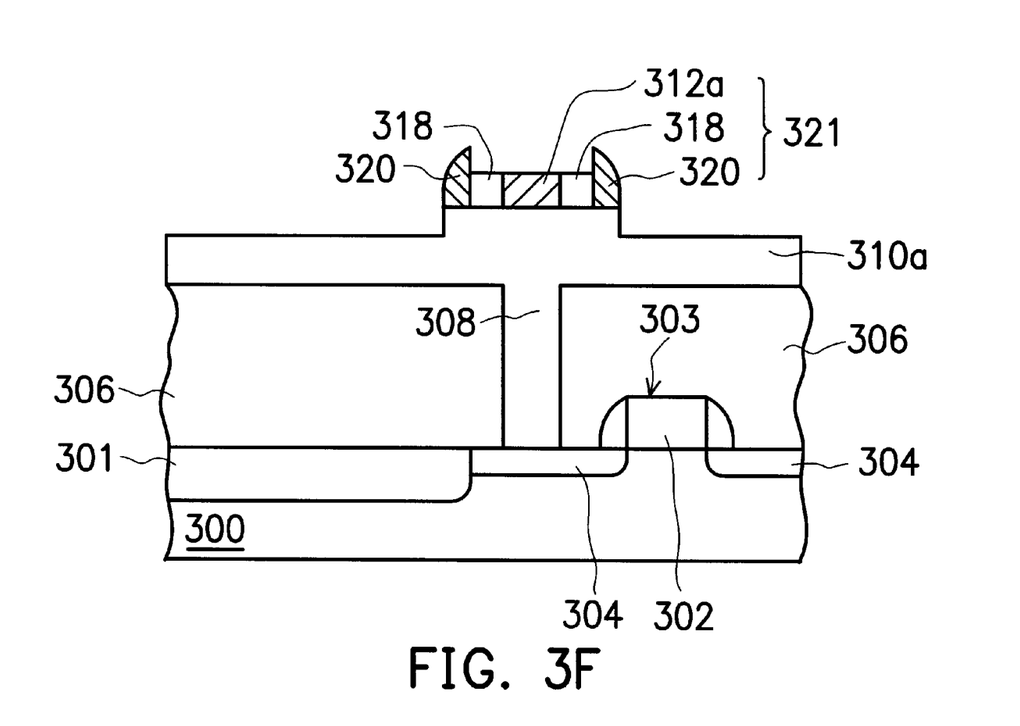

In FIG. 3F, the thin oxide layer 312a, the spacer 320, and the material layer 318 are used as etching stop layers. The second polysilicon layer 314a is removed by etching back. A top portion of the first polysilicon layer 310 is also removed simultaneously. Thus, the thickness of the first polysilicon layer 310 in the region not covered by the thin oxide layer 312a, the spacer 320, and the material layer 318 is reduced to a certain level forming a first polysilicon layer 310a. The portion of the first polysilicon layer 310 below the thin oxide layer 312a, the spacer 320, and the material layer 318 remains unchanged after etching. If desired, this portion of the first polysilicon layer 310 can be totally removed until the dielectric layer is exposed. The thin oxide layer 312a, the spacer 320, and the material layer 318 together form a storage-electrode region 321. The portion of the first polysilicon layer 310 below the storage-electrode region 321 remains after the etching. The first polysilicon layer 310 exposed by the thin oxide layer 312a, the spacer 320, and the material layer 318 is removed to leave a first polysilicon layer 310a.

Figure 3G:
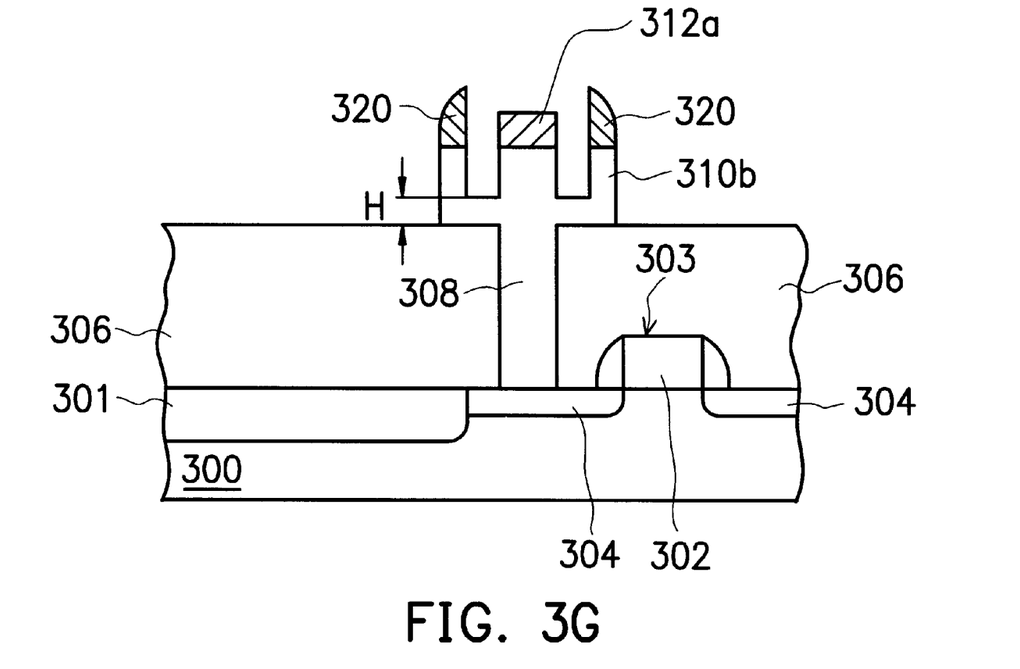

In FIG. 3G, the spacer 320 and the thin oxide layer 312a are used as masks when removing the material layer 318 and a portion of the first polysilicon layer 310a until a portion of the dielectric layer 306 is exposed. The first polysilicon layer 310a is patterned to form a first polysilicon layer 310b. The first polysilicon layer 310b below the material layer 318 of the region of storage-electrode region 321 remains with a thickness of H as indicated in FIG. 3G.

Figure 4:
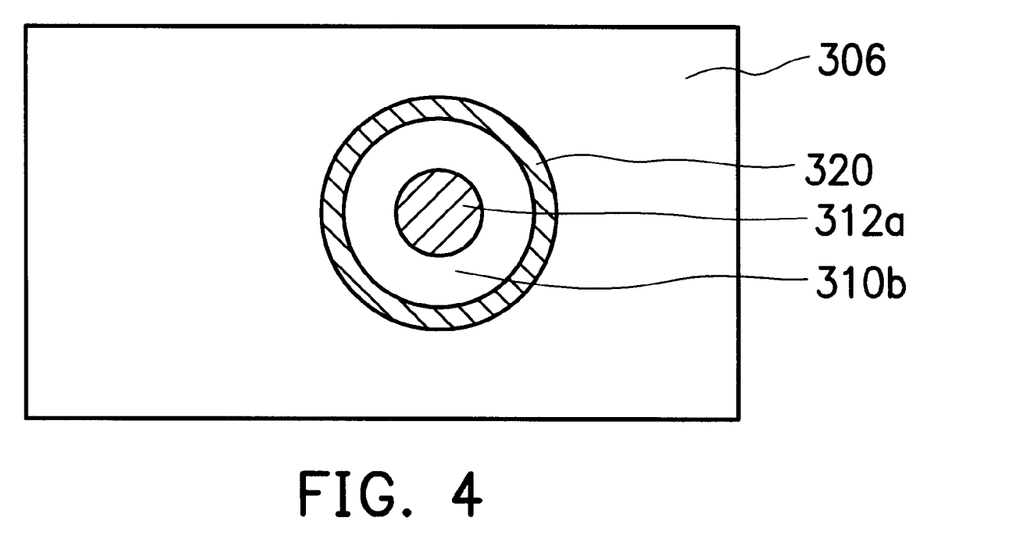
FIG. 4 is a schematic top view of the structure depicted in FIG. 3G.

Reference is made to FIG. 4, which shows a schematic, top view of the structure depicted in FIG. 3G. Preferably, the thin oxide layer 312a has a circular shape when viewed from the top. The first polysilicon layer 310b appears as a ring that encloses the thin oxide layer 312a when viewed from the top. Preferably, the spacer 320 is also a ring, and it encloses the first polysilicon layer 310b. The dielectric layer 306 encloses the spacer 320, when viewed from the top. The thin oxide layer 312a, the first polysilicon layer 310b, the spacer 320, and the dielectric layer 306 are concentric in this embodiment.

Figure 3H:
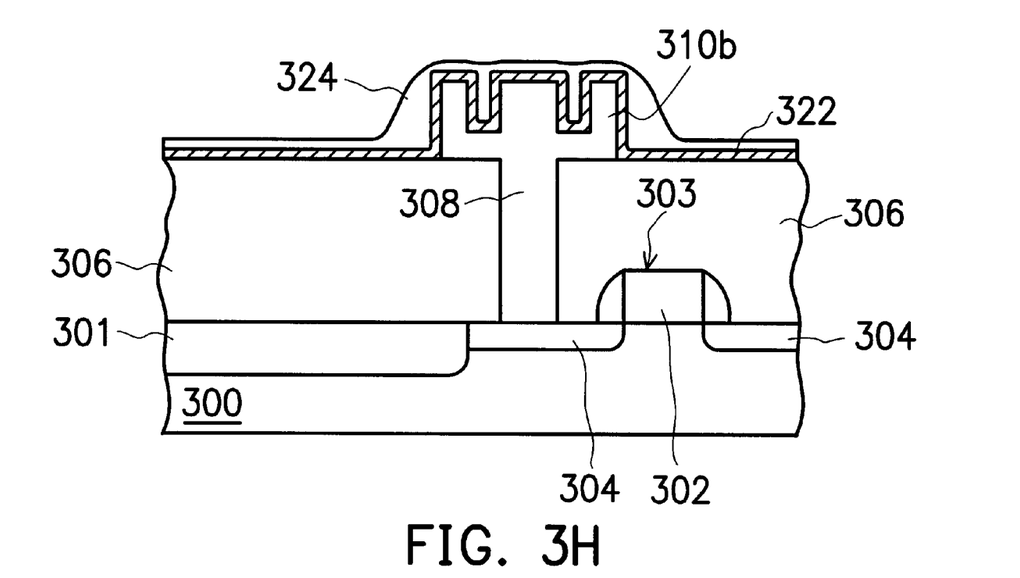

In FIG. 3H, the spacer 320 and the thin oxide layer 312a are removed to expose the first polysilicon layer 310b in a double-cylinder shape. The storage electrode is formed by the first polysilicon layer 310b. A dielectric layer 322 and a top electrode 324 are formed in sequence over the semiconductor substrate 300. The dielectric layer 322 can be, for example, a silicon oxide layer, a silicon nitride/silicon oxide (NO) layer, a silicon oxide/silicon nitride/silicon oxide (ONO) layer, a Ta$_2$O$_5$ layer or other layer with a high dielectric constant. The material of the top electrode 324 includes doped polysilicon.

The present invention provides a double-cylinder capacitor. In the invention, the storage area is enlarged to increase the capacitance. In contrast with the conventional fabricating method, which has to use two photolithography processes, only one photolithography process is performed in the invention method so that the process is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor, comprising the steps of:

proving a substrate having a transistor, wherein the transistor comprises a source/drain region and a gate, and the source/drain region is located in the substrate beside the gate;

forming a first dielectric layer over the substrate;

forming a storage node opening through the first dielectric layer to expose the source/drain region;

forming a first polysilicon layer over the first dielectric layer to fill the storage node opening and electrically couple with the source/drain region;

forming a thin oxide layer and a second polysilicon layer in sequence over the substrate;

removing a portion of the second polysilicon layer to leave a remaining portion of the second polysilicon layer aligned with the storage node opening;

removing a portion of the thin oxide layer to leave a remaining portion of the thin oxide layer aligned with the storage node opening, wherein planar area of the remaining thin oxide layer is smaller than that of the remaining portion of the second polysilicon layer, and sidewall of the remaining portion of the thin oxide layer is exposed;

forming a material layer around, and in contact with the sidewall of the remaining portion of the thin oxide layer, wherein combined planar area of the material layer and the remaining portion of the thin oxide layer is substantially the same as the planar area of the remaining portion of the second polysilicon layer;

forming a spacer on sidewall of the remaining portion of the second polysilicon layer and sidewall of the material layer;

using the thin oxide layer, the spacer, and the material layer as etching stop layers to remove the second polysilicon layer and a top portion of the first polysilicon layer exposed by the thin oxide layer, the spacer, and the material layer, wherein the remaining portion of the thin oxide layer, the spacer, and the material layer together form a storage-electrode region;

using the thin oxide layer and the spacer as masks to remove the material layer and a first of the first polysilicon layer until the dielectric layer is exposed, wherein a portion of the first polysilicon layer of the storage-electrode region is removed to leave a thickness under the former location of the material layer;

removing the remaining portion of the thin oxide layer and the spacer to form a storage electrode, wherein the storage electrode is formed by a second portion of the first polysilicon layer inside the storage-electrode region; and forming a second dielectric layer and a top electrode over the substrate.

2. The method of claim 1, wherein the step of removing a portion of the thin oxide layer includes isotropic etching.

3. The method of claim 1, wherein the material layer includes a silicon nitride layer.

4. The method of claim 1, wherein the spacer includes an oxide spacer.

5. The method of claim 1, wherein the etching rate of the spacer and the etching rate of the thin oxide layer are substantially the same.

6. The method of claim 1, wherein the step of forming the spacer includes etching back anisotropocally.

7. The method of claim 1, wherein the step of removing the second polysilicon layer includes blanked etching.

8. The method of claim 1, wherein the second dielectric layer includes a silicon nitride/silicon oxide (NO) layer.

9. The method of claim 1, wherein the second dielectric layer includes a silicon oxide/silicon nitride/silicon oxide layer.

10. The method of claim 1, wherein the second dielectric layer includes a $Ta_2O_5$ layer.

11. The method of claim 1, wherein the material of the top electrode includes doped polysilicon.

12. A method of fabricating a storage electrode, wherein the storage electrode is suitable for a substrate having a dielectric layer formed thereon, and a storage node opening is formed through the dielectric layer to expose a source/drain region, comprising the steps of:

forming a first polysilicon layer over the dielectric layer to fill the storage node opening, wherein the first polysilicon layer is electrically coupled with the source/drain region through the storage node opening;

forming a thin oxide layer, a second polysilicon layer, and a material layer over the first polysilicon layer, wherein the second polysilicon layer is located on the thin oxide layer and the material layer, the material layer encloses the thin oxide layer, and the material layer and the thin oxide layer are aligned with the storage node opening;

forming a spacer on sidewall of the second polysilicon layer and sidewall of the material layer;

using the thin oxide layer, the spacer, and the material layer as etching stop layers to remove the second polysilicon layer, and to partially remove a top portion of the first polysilicon layer exposed by the thin oxide layer, the spacer, and the material layer, wherein regions containing the thin oxide layer, the spacer, and the material layer form a storage-electrode region;

using the thin oxide layer and the spacer as masks to remove the material layer and the remaining portion of the first polysilicon layer until the dielectric layer is exposed, wherein the first polysilicon layer under the material layer of the storage-electrode region is removed to leave a thickness under the former location of the material layer; and removing the thin oxide layer and the spacer.

13. The method of claim 12, wherein the material layer includes a silicon nitride layer.

14. The method of claim 12, wherein the spacer includes an oxide spacer.

15. The method of claim 12, wherein the etching rate of the spacer and the etching rate of the thin oxide layer are the same.

16. The method of claim 12, wherein the step of forming the spacer includes etching back anisotropically.

17. The method of claim 12, wherein the step of removing the second polysilicon layer includes blanket etching.

* * * * *